(12) United States Patent
Kataoka (10) Patent No.: US 7,974,056 B2
(45) Date of Patent: Jul. 5, 2011

(54) SEMICONDUCTOR DEVICE

(75) Inventor: Shinichiro Kataoka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/521,218

(22) PCT Filed: Feb. 4, 2009

(86) PCT No.: PCT/JP2009/000419
§ 371 (c)(1),
(2), (4) Date: Jun. 25, 2009

(87) PCT Pub. No.: WO2009/101770
PCT Pub. Date: Aug. 20, 2009

(65) Prior Publication Data
US 2011/0007437 A1    Jan. 13, 2011

(30) Foreign Application Priority Data
Feb. 15, 2008    (JP) .................................. 2008-033860

(51) Int. Cl.
*H02H 9/00* (2006.01)
(52) U.S. Cl. ........ 361/56; 361/91.1; 361/91.5; 361/91.6
(58) Field of Classification Search ............ 361/56, 361/91.1, 91.5, 91.6
See application file for complete search history.

(56) References Cited

U.S. PATENT DOCUMENTS

| 5,604,655 | A | 2/1997 | Ito | 361/56 |
| 6,218,881 | B1 | 4/2001 | Hiraga | 327/310 |
| 7,064,942 | B2 * | 6/2006 | Ker et al. | 361/56 |
| 2004/0233595 | A1 * | 11/2004 | Ker et al. | 361/56 |
| 2005/0099744 | A1 | 5/2005 | Kitagawa | 361/56 |
| 2005/0237681 | A1 * | 10/2005 | Chen | 361/56 |

FOREIGN PATENT DOCUMENTS

| JP | 1-110782 | 4/1989 |
| JP | 2006-278526 | 10/2006 |
| JP | 2006-332482 | 12/2006 |
| JP | 2007-336262 | 12/2007 |
| WO | WO 2008/050779 A1 | 5/2008 |

* cited by examiner

*Primary Examiner* — Patrick Salce
(74) *Attorney, Agent, or Firm* — Steptoe & Johnson LLP (57) ABSTRACT

A semiconductor device which can achieve high breakdown voltage and high ESD tolerance of a current drive output terminal at the same time, and can quicken the response speed of a current flowing through the current drive output terminal. The inventive semiconductor device is provided, between the current drive output terminal and a first transistor or a low breakdown voltage element, with a second transistor having a breakdown voltage higher than that of the first transistor or that of the low breakdown voltage element. Furthermore, the inventive semiconductor device is provided with a diode having an anode connected with a path between the first transistor or the low breakdown voltage element and the second transistor, and a cathode connected with an ESD protection circuit.

11 Claims, 5 Drawing Sheets

SEMICONDUCTOR DEVICE

TECHNICAL FIELD

The present invention relates to a semiconductor device such as an LED driver IC.

BACKGROUND ART

Figure 9:
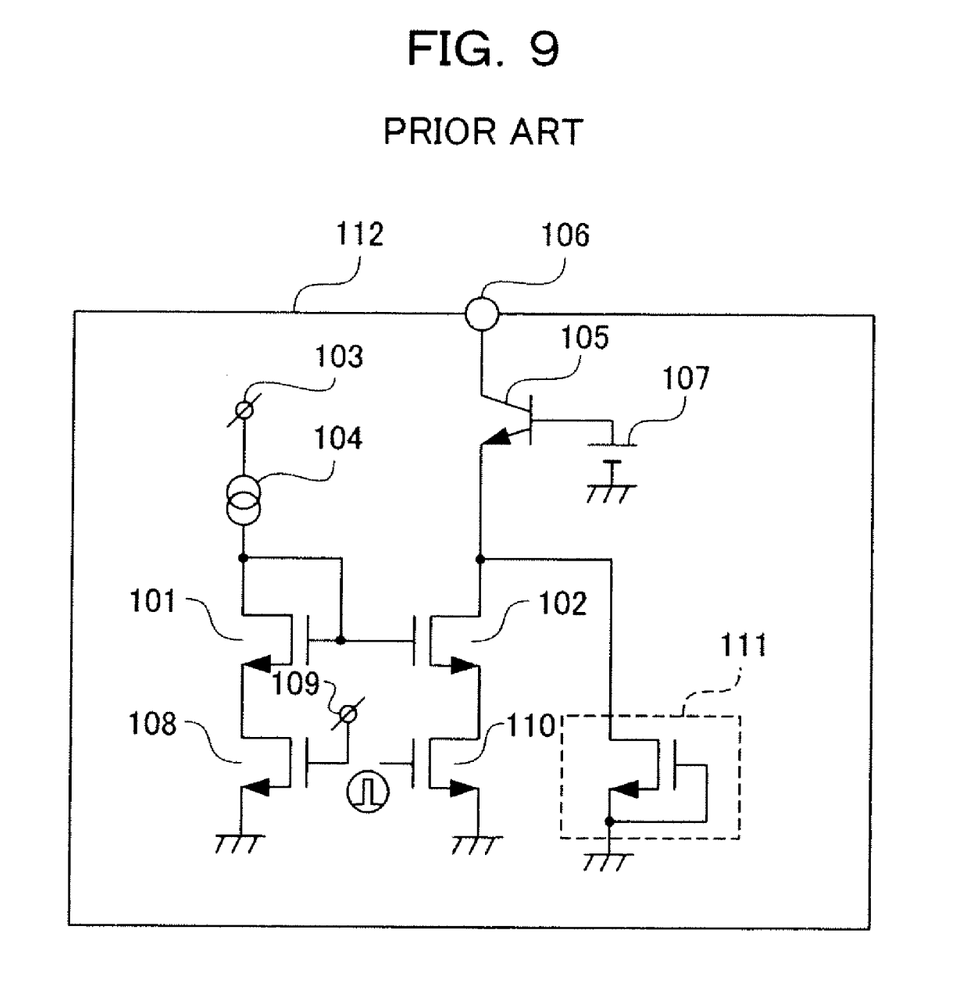
FIG. 9 shows the schematic configuration of the main part of a semiconductor device according to the prior art.

FIG. 9 shows a circuit proposed as a circuit for simultaneously increasing the withstand voltage of a current driving output terminal and the ESD tolerance of the current driving output terminal in a semiconductor device such as an LED driver IC (for example, see Patent document 1). The following will describe the circuit shown in FIG. 9.

N-channel MOS transistors 101 and 102 compose a current mirror circuit. The drain of the N-channel MOS transistor 101 composing the current mirror circuit is connected to a constant current source 104 and the drain of the N-channel MOS transistor 102 is connected to the emitter of an NPN bipolar transistor 105. Hereinafter, the NPN bipolar transistor 105 will be simply referred to as the NPN transistor 105. A constant voltage source 103 acts as the current supply source of the constant current source 104.

The collector of the NPN transistor 105 connected to the N-channel MOS transistor 102 is connected to a current driving output terminal 106, and the base of the NPN transistor 105 is connected to a constant voltage source 107. In this way, the N-channel MOS transistor 102 and the NPN transistor 105 are cascoded and the NPN transistor 105 is used as a so-called cascode transistor. The collector of the NPN transistor 105 has a withstand voltage higher than the drain withstand voltage of the N-channel MOS transistor, and the NPN transistor 105 increases the withstand voltage of the output terminal 106. Hereinafter, the current driving output terminal 106 will be simply referred to as the output terminal 106.

The source of the N-channel MOS transistor 101 is connected to the drain of an N-channel MOS transistor 108. The source of the N-channel MOS transistor 108 is grounded. Further, the gate of the N-channel MOS transistor 108 is connected to a constant voltage source 109.

The source of the N-channel MOS transistor 102 is connected to the drain of an N-channel MOS transistor 110. The source of the N-channel MOS transistor 110 is grounded. Further, a pulse is supplied to the gate of the N-channel MOS transistor 110 and controls the on/off of current passing through the output terminal 106, that is, the on/off of the emitter current of the NPN transistor 105.

A drain-to-source resistance value obtained when the N-channel MOS transistor 110 is turned on is set equal to the drain-to-source resistance value of the N-channel MOS transistor 108. Thus it is possible to increase the output current accuracy of the current mirror circuit made up of the N-channel MOS transistors 101 and 102, that is, the accuracy of current passing through the output terminal 106.

An ESD protection circuit 111 is connected to the junction of the emitter of the NPN transistor 105 and the drain of the N-channel MOS transistor 102. The ESD protection circuit 111 is made up of an N-channel MOS transistor. To be specific, the drain of the N-channel MOS transistor is connected to the junction of the emitter of the NPN transistor 105 and the drain of the N-channel MOS transistor 102, and the gate and source of the N-channel MOS transistor are both grounded.

By using the ESD protection circuit 111 made up of the element having a breakdown voltage close to the breakdown voltages of the N-channel MOS transistors 102 and 110, the N-channel MOS transistors 102 and 110 connected to the output terminal 106 can be protected from ESD (electrostatic discharge). This is because ESD having been applied to the output terminal 106 and passed through the NPN transistor 105 can be released to the ESD protection circuit 111.

The N-channel MOS transistors 101, 102, 108, and 110 the constant voltage sources 103, 107, and 109, the constant current source 104, the NPN transistor 105, and the N-channel MOS transistor composing the ESD protection circuit 111 are integrated on the same semiconductor substrate 112.

In order to increase the withstand voltage of the current driving output terminal and simultaneously protect from ESD the N-channel MOS transistors connected to the current driving output terminal, the foregoing circuit is provided in a semiconductor device. In other words, the semiconductor device includes the circuit configured such that the NPN bipolar transistor acting as a cascode transistor is interposed between the N-channel MOS transistor and the current driving output terminal and the drain of the N-channel MOS transistor having the grounded gate and source is connected to a path between the NPN bipolar transistor and the N-channel MOS transistor.

However, the semiconductor device configured thus has a problem as will be described below. The N-channel MOS transistor composing the ESD protection circuit 111 has a long channel width because the longer the channel width, the larger the ESD tolerance. Thus a parasitic capacitance increases on the drain of the N-channel MOS transistor composing the ESD protection circuit 111. For this reason, the response speed of current passing through the output terminal 106 decreases relative to the pulse which is supplied to the gate of the N-channel MOS transistor 110 to control the on/off of current passing through the output terminal 106.

Patent document 1: Japanese Patent Laid-Open No. 2007-336262

DISCLOSURE OF THE INVENTION

The present invention has been devised in view of the foregoing problem. An object of the present invention is to provide a semiconductor device which can increase the withstand voltage of a current driving output terminal and the ESD tolerance of the current driving output terminal and improve the response speed of current passing through the current driving output terminal.

In order to attain the object, a semiconductor device of the present invention includes a current driving output terminal; one of a first transistor and a low withstand voltage element; a second transistor having a terminal connected to the current driving output terminal, a terminal connected to one of the first transistor and the low withstand voltage element, and a control terminal, and having a higher withstand voltage than one of the first transistor and the low withstand voltage element; an ESD protection circuit; and a diode having an anode connected to a path between one of the first transistor and the low withstand voltage element and the second transistor and a cathode connected to the ESD protection circuit.

The semiconductor device of the present invention, wherein the control terminal of the second transistor is preferably fed with a voltage set so as to normally turn off the diode.

The semiconductor device of the present invention may further include a terminal different from the current driving output terminal, the terminal being connected to the junction of the ESD protection circuit and the diode.

The semiconductor device of the present invention further includes a plurality of current driving output circuits, each having one of the first transistor and the low withstand voltage element, the second transistor, and the diode, wherein the diodes of the current driving output circuits may be connected in common to the ESD protection circuit.

The semiconductor device of the present invention, wherein the semiconductor device may include the plurality of first transistors connected in common to the second transistor.

The semiconductor device of the present invention, wherein the diode may have a P-type diffusion layer and an N-type diffusion layer composing a PN junction with the P-type diffusion layer, the P-type diffusion layer acts as an anode, and the N-type diffusion layer acts as a cathode.

The semiconductor device of the present invention may further include a voltage clamping circuit connected to the terminal of the second transistor, the terminal being connected to one of the first transistor and the low withstand voltage element.

The semiconductor device of the present invention, wherein the second transistor may be one of a high withstand voltage MOS transistor and a bipolar transistor and the first transistor may be a MOS transistor having a lower withstand voltage than the second transistor.

The semiconductor device of the present invention, wherein the second transistor may be one of a high withstand voltage MOS transistor and a bipolar transistor and the low withstand voltage element may be a capacitor.

The semiconductor device of the present invention, wherein the ESD protection circuit may be made up of an N-channel MOS transistor having a drain connected to the diode and having a grounded gate and source or having a gate-to-source voltage set to be not higher than the threshold voltage of the gate.

The semiconductor device of the present invention, wherein the ESD protection circuit may be a low impedance circuit.

According to a preferred embodiment of the present invention, a second transistor having a higher withstand voltage than one of a first transistor and a low withstand voltage element is interposed between a current driving output terminal and one of the first transistor and the low withstand voltage element and an ESD protection circuit is connected to a path between one of the first transistor and the low withstand voltage element and the second transistor. Thus it is possible to increase the withstand voltage of the current driving output terminal and protect one of the first transistor and the low withstand voltage element from a high voltage such as ESD applied to the current driving output terminal from the outside. The second transistor may be a high withstand voltage MOS transistor such as a power MOS transistor, a bipolar transistor, and so on.

Further, according to the preferred embodiment of the present invention, unlike in the prior art, the drain of the N-channel MOS transistor having a large parasitic capacitance is not directly connected to a path between one of the first transistor and the low withstand voltage element and the second transistor but the ESD protection circuit is connected via a diode. Thus it is possible to improve the response speed of current passing through the current driving output terminal.

Moreover, according to the preferred embodiment of the present invention, the ESD protection circuit is shared by the current driving output terminal and other terminals, thereby increasing the ESD tolerances of the terminals other than the current driving output terminal while suppressing a circuit size.

BEST MODE FOR CARRYING OUT THE INVENTION

The following will describe semiconductor devices according to embodiments of the present invention with reference to the accompanying drawings. In the following explanation, an LED driver IC for driving an LED will be described as the semiconductor device of the present invention. As a matter of course, the semiconductor device of the present invention is not limited to an LED driver IC.

First Embodiment

Figure 1:
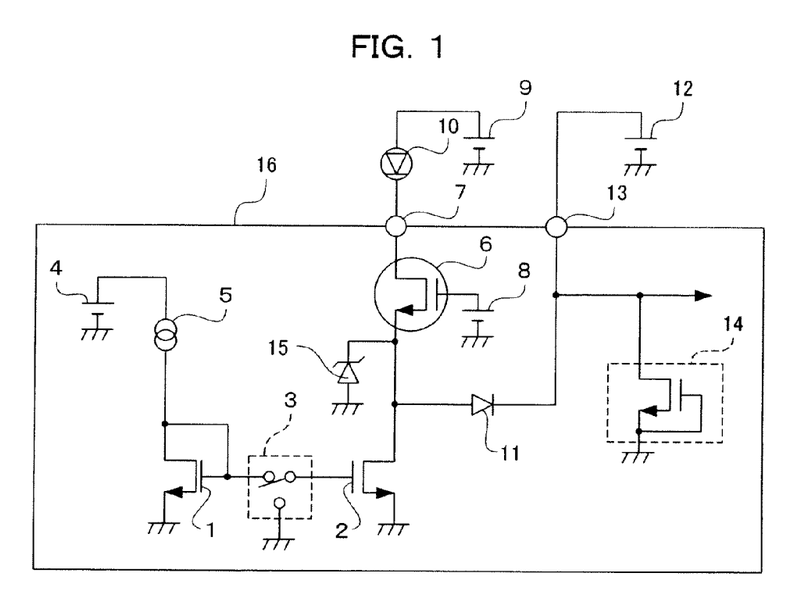
FIG. 1 shows the schematic configuration of the main part of a semiconductor device according to a first embodiment of the present invention.

Referring to FIG. 1, the following will describe a semiconductor device according to a first embodiment of the present invention. FIG. 1 shows the schematic configuration of the main part of the semiconductor device according to the first embodiment of the present invention.

A switch circuit 3 is connected between a gate serving as the control terminal of an N-channel MOS transistor 1 and a gate serving as the control terminal of an N-channel MOS transistor 2. The N-channel MOS transistors 1 and 2 compose a current mirror circuit when the switch circuit 3 is turned on.

A drain serving as the input terminal of the N-channel MOS transistor 1 is connected to a constant current source 5. A constant voltage source 4 acts as the current supply source of the constant current source 5. A source serving as the output terminal of the N-channel MOS transistor 1 is grounded. A drain serving as the input terminal of the N-channel MOS transistor 2 is connected to a source serving as the output terminal of a high withstand voltage N-channel MOS transistor 6 having a high drain withstand voltage. A source serving as the output terminal of the N-channel MOS transistor 2 is grounded. Hereinafter, the high withstand voltage N-channel MOS transistor 6 will be simply referred to as the high withstand voltage transistor 6. For the high withstand voltage transistor 6, for example, a DMOS (double diffused metal oxide semiconductor) can be used.

A drain serving as the input terminal of the high withstand voltage transistor 6 connected to the N-channel MOS transistor 2 is connected to an LED driving output terminal 7 serving as a current driving output terminal. Hereinafter, the LED driving output terminal 7 will be simply referred to as the output terminal 7. A gate serving as the control terminal of the high withstand voltage transistor 6 is connected to a constant voltage source 8. The N-channel MOS transistor 2 serving as a first transistor and the high withstand voltage transistor 6 serving as a second transistor are cascoded thus and the high withstand voltage transistor 6 is used as a so-called cascode transistor. The drain withstand voltage of the high withstand voltage transistor 6 is higher than the drain withstand voltage of the N-channel MOS transistor 2, and the high withstand voltage transistor 6 increases the withstand voltage of the output terminal 7.

The high withstand voltage transistor 6 has a larger ESD tolerance than the N-channel MOS transistor 2. The ESD tolerance increases with a gate width and thus the gate width of the high withstand voltage transistor 6 is set long enough to obtain a necessary ESD tolerance. In other words, ESD from the output terminal 7 is handled by increasing the gate length.

Further, the gate voltage of the high withstand voltage transistor 6 is set such that the source voltage of the high withstand voltage transistor 6 is equal to or lower than the drain withstand voltage of the N-channel MOS transistor 2 and a diode 11, which will be described later, is normally turned off. For example, the gate voltage of the high withstand voltage transistor 6 is set at the same voltage as a voltage generated by a constant voltage source 12 connected to a power supply input terminal 13 which will be described later, or the gate voltage of the high withstand voltage transistor 6 is set at a voltage having been reduced by the diode voltage drop of the diode 11 from the voltage generated by the constant voltage source 12. A diode voltage is a voltage obtained when current passes from an anode to a cathode.

The output terminal 7 is connected to an LED 10 fed with a voltage from a constant voltage source 9. When the switch circuit 3 provided between the gates of the N-channel MOS transistors 1 and 2 is turned on and the gates of the N-channel MOS transistors 1 and 2 are connected to each other, current having a current value determined by the current mirror circuit made up of the N-channel MOS transistors 1 and 2 passes from the constant voltage source 9 to the N-channel MOS transistor 2 through the LED 10, the output terminal 7, and the high withstand voltage transistor 6. When the switch circuit 3 is turned off, the gate of the N-channel MOS transistor 2 is grounded and the drain current of the N-channel MOS transistor 2 is cut off. The switch circuit 3 can control the on/off of the N-channel MOS transistor 2 connected to the output terminal 7 via the high withstand voltage transistor 6. In response to the on/off of the N-channel MOS transistor 2, the on/off of current passing through the output terminal 7, that is, the on/off of the driving current of the LED 10 is controlled. The explanation of a configuration for controlling the on/off of the switch circuit 3 is omitted.

As has been discussed, in the semiconductor device, the high withstand voltage transistor 6 in which a drain current and a source current are always equal to each other is used as a cascode transistor instead of an NPN bipolar transistor used in the prior art. Thus even when the constant voltage source 9 generates a low voltage or the terminal voltage of the output terminal 7 is set low on purpose to reduce the power consumption or heat generation of an IC, it is possible to keep the accuracy of current passing through the output terminal 7. In other words, when an NPN bipolar transistor is used as a cascode transistor, the base current of the NPN bipolar transistor increases and current having a different current value from the current value determined by the current mirror circuit passes through the current driving output terminal in a saturated state of the NPN bipolar transistor at a low voltage of the current driving output terminal. Thus the use of the NPN bipolar transistor may decrease the current accuracy of the current driving output terminal. The semiconductor device can avoid such a situation unlike in the prior art. Although the single LED is driven in this example, the semiconductor device is also applicable when driving a plurality of LEDs connected in series. Even when the voltage of the output terminal 7 is reduced to drive a plurality of LEDs, the semiconductor device can keep the high current accuracy of the output terminal 7.

In the semiconductor device, the switch circuit 3 is connected to the gate of the N-channel MOS transistor 2 and the on/off of output current is controlled in response to the on/off of the switch circuit 3, that is, the on/off of the current passing through the output terminal 7 is controlled in response to the on/off of the switch circuit 3. A switching N-channel MOS transistor may be connected in series to the drain or source of the N-channel MOS transistor 2 and the on/off of output current may be controlled in response to the on/off of the switching N-channel MOS transistor. However, by controlling the on/off of output current in response to the on/off of the switch circuit 3 connected to the gate of the N-channel MOS transistor 2, the output terminal 7 can be operated at a lower voltage.

In the semiconductor device, the on/off of output current is controlled in response to the on/off of the switch circuit 3 connected to the gate of the N-channel MOS transistor 2. The on/off of output current may be controlled by controlling, for example, the on/off of the high withstand voltage transistor 6. In this case, the switch circuit 3 is not necessary.

The following will describe the ESD protective function of the semiconductor device. In the semiconductor device, the anode of the diode 11 is connected to the junction of the source of the high withstand voltage transistor 6 and the drain of the N-channel MOS transistor 2, that is, a path between the high withstand voltage transistor 6 and the N-channel MOS transistor 2. The cathode of the diode 11 is connected to the power supply input terminal 13 connected to the external constant voltage source 12. The power supply input terminal 13 is a different terminal from the current driving output terminal. The constant voltage source 12 acts as a power supply of the internal circuit of the semiconductor device.

An ESD protection circuit 14 is connected to the junction of the cathode of the diode 11 and the power supply input terminal 13. In this configuration, the ESD protection circuit 14 is made up of an N-channel MOS transistor. To be specific, the drain of the N-channel MOS transistor is connected to the cathode of the diode 11 and the gate and the source of the N-channel MOS transistor are both grounded. When a gate-to-source voltage is set at the threshold voltage of the gate or lower, a resistor may be interposed, for example, between the gate and a ground potential and/or between the source and the ground potential.

Thus the ESD protection circuit 14 is preferably used which is made up of an element having a breakdown voltage close to the breakdown voltage of the N-channel MOS transistor 2. With this configuration, ESD having been applied to the output terminal 7 and passed through the high withstand voltage transistor 6 can be released to the ESD protection circuit 14 through the diode 11, so that the N-channel MOS transistor 2 can be protected from ESD. In other words, it is possible to prevent ESD from breaking the N-channel MOS transistor 2.

The ESD protection circuit 14 is also connected to the power supply input terminal 13 which is a different terminal from the current driving output terminal. Thus by the ESD protection circuit 14 for protecting the N-channel MOS transistor 2 from ESD, the circuit element connected to the power supply input terminal 13 can be protected from ESD applied from the power supply input terminal 13.

In the case of the ESD protection circuit made up of the N-channel MOS transistor, the channel width of the N-channel MOS transistor is set long. This is because an ESD tolerance can increase with a channel width. In this configuration, although the N-channel MOS transistor composing the ESD protection circuit increases in element size, a circuit size can be suppressed in the semiconductor device because the ESD protection circuit for increasing the ESD tolerances of the output terminal 6 and the power supply input terminal 13 is shared. Considering a withstand voltage, the ESD protection circuit cannot be directly connected to the output terminal 7. When the ESD protection circuit is made up of a bipolar transistor, the ESD protection circuit has a higher breakdown voltage than the N-channel MOS transistor 2 to be protected from ESD, so that the N-channel MOS transistor 2 cannot be protected.

The following will describe a Zener diode 15. The cathode of the Zener diode 15 is connected to the source of the high withstand voltage transistor 6. The anode of the Zener diode 15 is grounded. The Zener diode 15 is used as a voltage clamping circuit based on a ground potential. In other words, the Zener diode voltage of the Zener diode 15 is higher than the drain voltage of the N-channel MOS transistor 2 during a normal operation and is lower than the drain withstand voltage of the N-channel MOS transistor 2. The Zener diode voltage is a voltage obtained when current passes from a cathode to an anode. Thus it is possible to prevent a situation in which the voltage of the output terminal 7 rapidly changes, a voltage not lower than the drain withstand voltage of the N-channel MOS transistor 2 is transiently applied to the drain of the N-channel MOS transistor 2 by the drain-to-source parasitic capacitance and the like of the high withstand voltage transistor 6, and the N-channel MOS transistor 2 is broken. The Zener diode 15 also has the effect of protecting the N-channel MOS transistor 2 from ESD from the output terminal 7.

The N-channel MOS transistors 1 and 2, the switch circuit 3, the constant voltage sources 4 and 8, the constant current source 5, the high withstand voltage transistor 6, the diode 11, the N-channel MOS transistor composing the ESD protection circuit 14, and the Zener diode 15 are integrated on the same semiconductor substrate 16. However, the constant voltage sources 4 and 8 may be separately provided without being integrated on the same semiconductor substrate 16. In this case, the input terminal of the constant current source 5 and the gate terminal of the high withstand voltage transistor 6 are connected to a power supply line.

As has been discussed, the semiconductor device can increase the withstand voltage of the output terminal 7 and simultaneously achieve a low-voltage operation on the output terminal 7. By protecting the N-channel MOS transistor 2 with the ESD protection circuit 14 through the diode 11, a high ESD tolerance can be achieved. Further, the ESD protection circuit having a large parasitic capacitance is not directly connected to the drain of the N-channel MOS transistor 2 but is connected via the diode 11 having a small parasitic capacitance. Thus the response speed of output current is high in response to the on/off operation of the switch circuit 3, that is, the response speed of current passing through the output terminal 7 is high. Moreover, the N-channel MOS transistor 2 and the circuit element connected to the power supply input terminal 13 are both protected by the single ESD protection circuit 14, thereby achieving a smaller chip size than a configuration in which an ESD protection circuit is provided for each terminal.

In the foregoing configuration, the N-channel MOS transistor is connected to the current driving output terminal via the high withstand voltage transistor. The foregoing configuration is also applied to a configuration in which a circuit including a low withstand voltage element susceptible to ESD breakdown, for example, a circuit including a capacitor is connected to a current driving output terminal. In other words, the high withstand voltage transistor is interposed between the current driving output terminal and the low withstand voltage element, the anode of the diode is connected to a path between the current driving output terminal and the low withstand voltage element, and the cathode of the diode is connected to the ESD protection circuit, so that the low withstand voltage element can be protected.

The foregoing explanation described the circuit for controlling the on/off of output current. For example, the switch circuit 3 may be always turned on and the output current may be always turned on. Even the circuit configured thus can increase the ESD tolerance and improve the current accuracy when the output terminal has a low voltage.

Although the single diode 11 is provided in the foregoing circuit, a plurality of diodes may be connected in series so as to hardly pass current or a plurality of diodes may be connected in parallel to improve current-carrying ability, depending on the relationship between voltages generated by the constant voltage source 8 and the constant voltage source 12. A voltage drop caused by ESD can decrease with an increase in the current-carrying ability. Depending on the relationship between voltages generated by the constant voltage source 8 and the constant voltage source 12, a Zener diode may be used instead of the diode 11 as long as the diode is normally turned off.

Figure 2:
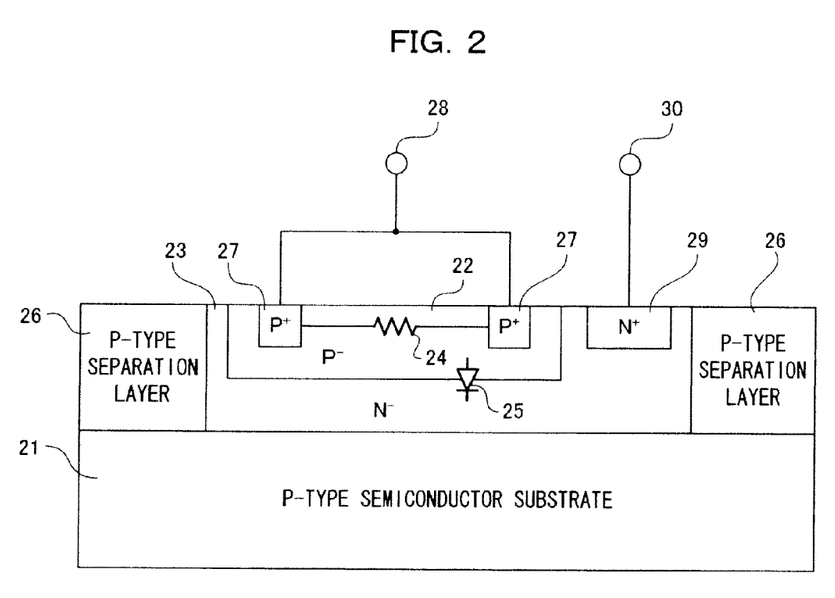
FIG. 2 is a sectional view showing an example of the configuration of a diode included in semiconductor devices according to first to seventh embodiments of the present invention.

A configuration shown in FIG. 2 will be described as an example of the configuration of the diode 11. FIG. 2 shows an example of the cross-sectional configuration of the diode 11. As shown in FIG. 2, a diode may be configured by a PN junction of an $N^-$-type diffusion layer 23 which is formed on a P-type semiconductor substrate 21 and has a low impurity concentration and a $P^-$-type diffusion layer 22 which is formed in the $N^-$-type diffusion layer 23, composes a resistor, and has a low impurity concentration. FIG. 2 shows an equivalent circuit 24 of the resistor made up of the $P^-$-type diffusion layer 22 and an equivalent circuit 25 of the diode configured by the PN junction of the $N^-$-type diffusion layer 23 and the $P^-$-type diffusion layer 22. The $N^-$-type diffusion layer 23 may be formed so as to surround the $P^-$-type diffusion layer 22. A P-type separation base layer 26 may be formed so as to surround the $N^-$-type diffusion layer 23.

Further, a $P^+$-type diffusion layer 27 having a high impurity concentration is formed in the $P^-$-type diffusion layer 22 and a node 28 connected to the $P^+$-type diffusion layer 27 serves as an anode. Also in the $N^-$-type diffusion layer 23, an $N^+$-type diffusion layer 29 having a high impurity concentration is formed, and a node 30 connected to the $N^+$-type diffusion layer 29 serves as a cathode.

As has been discussed, a resistance element formed on the semiconductor substrate can be used as a diode. Moreover, various elements including an NPN transistor and a PNP transistor with PN junctions can be used as diodes.

Second Embodiment

Figure 3:
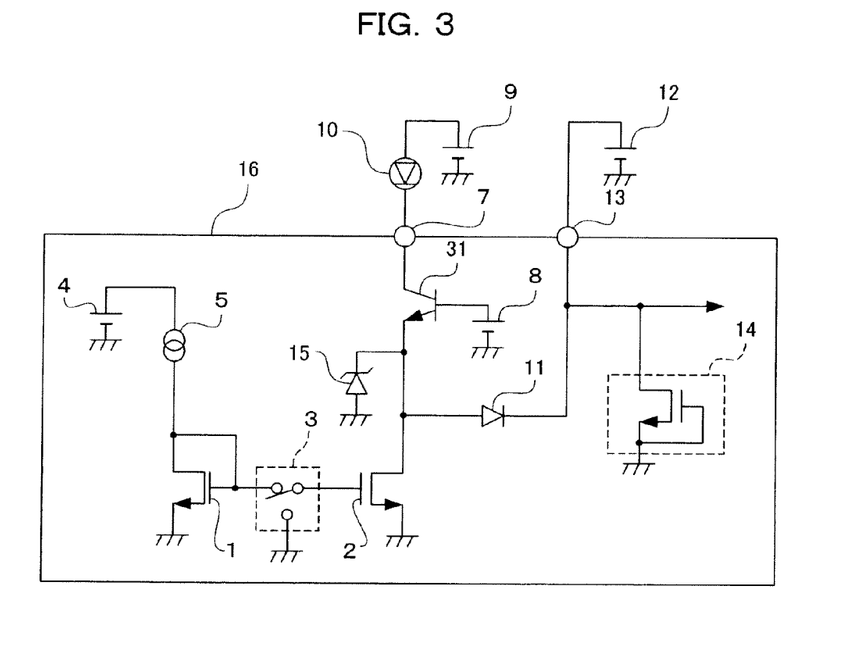
FIG. 3 shows the schematic configuration of the main part of the semiconductor device according to the second embodiment of the present invention.

Referring to FIG. 3, the following will describe a semiconductor device according to a second embodiment of the present invention. Members corresponding to the members described in the first embodiment will be indicated by the same reference numerals and the explanation thereof is omitted.

FIG. 3 shows the schematic configuration of the main part of the semiconductor device according to the second embodiment of the present invention. As shown in FIG. 3, the semiconductor device is different from the semiconductor device of the first embodiment in that an NPN bipolar transistor 31 is used as a high withstand voltage cascode transistor connected to an output terminal 7. Hereinafter, the NPN bipolar transistor 31 will be simply referred to as the NPN transistor 31.

As in the first embodiment, the base voltage of the NPN transistor 31 is set such that the emitter voltage of the NPN transistor 31 is equal to or lower than the drain withstand voltage of an N-channel MOS transistor 2 and a diode 11 is normally turned off.

Thus the NPN transistor 31 provided between the output terminal 7 and the N-channel MOS transistor 2 can achieve the same effect as the first embodiment, though the current accuracy of the output terminal 7 may decrease as has been discussed in the first embodiment when the output terminal 7 has a low voltage.

Third Embodiment

Figure 4:
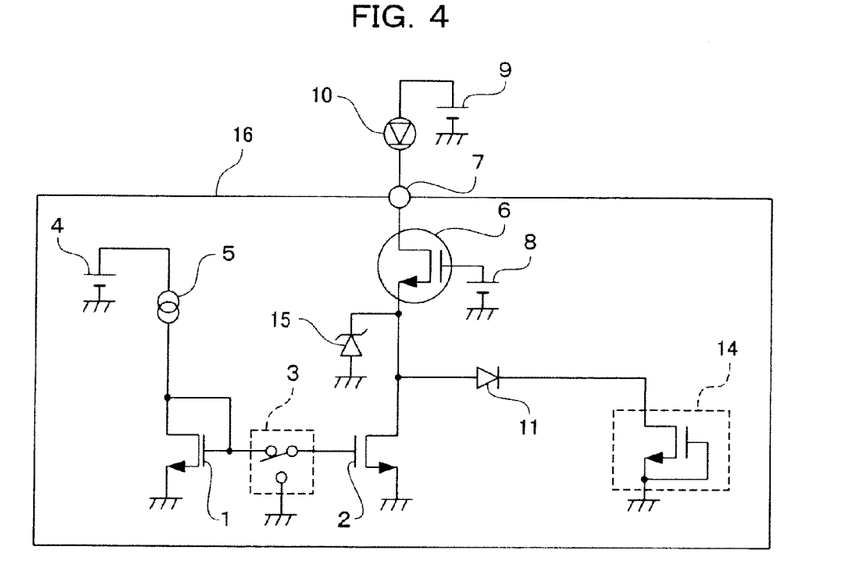
FIG. 4 shows the schematic configuration of the main part of the semiconductor device according to the third embodiment of the present invention.

Referring to FIG. 4, the following will describe a semiconductor device according to a third embodiment of the present invention. Members corresponding to the members described in the first embodiment will be indicated by the same reference numerals and the explanation thereof is omitted.

FIG. 4 shows the schematic configuration of the main part of the semiconductor device according to the third embodiment of the present invention. As shown in FIG. 4, the semiconductor device is different from the semiconductor device of the first embodiment in that the cathode of a diode 11 is in contact only with an ESD protection circuit 14.

According to the semiconductor device, the ESD protection circuit cannot be shared by an LED driving output terminal and a power supply input terminal unlike in the first embodiment. However, the ESD protection circuit 14 can be disposed with higher flexibility which reduces restrictions on layout. Thus it is possible to reduce a wiring impedance across the diode 11 and improve an ESD tolerance. Furthermore, it is possible to obtain the same effect as the first embodiment. As in the second embodiment, an NPN bipolar transistor may be provided instead of a high withstand voltage transistor 6.

Fourth Embodiment

Figure 5:
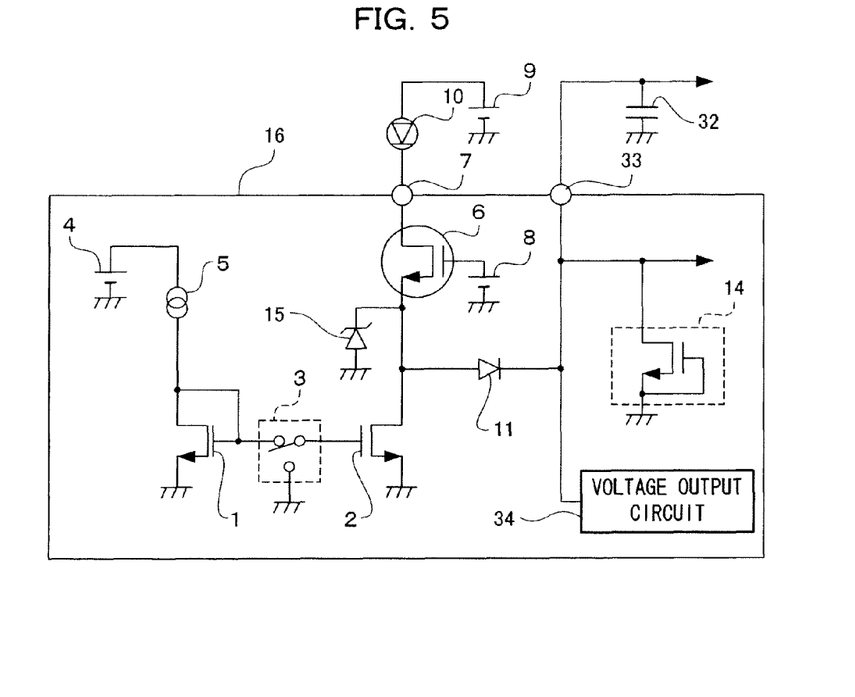
FIG. 5 shows the schematic configuration of the main part of the semiconductor device according to the fourth embodiment of the present invention.

Referring to FIG. 5, the following will describe a semiconductor device according to a fourth embodiment of the present invention. Members corresponding to the members described in the first embodiment will be indicated by the same reference numerals and the explanation thereof is omitted.

FIG. 5 shows the schematic configuration of the main part of the semiconductor device according to the fourth embodiment of the present invention. As shown in FIG. 5, the cathode of a diode 11 is connected to a voltage output terminal 33. The voltage output terminal 33 is a different terminal from a current driving output terminal. The voltage output terminal 33 is connected to a capacitor 32 provided outside the semiconductor device and is connected to a voltage output circuit 34 provided in the semiconductor device. The semiconductor device supplies a voltage into the semiconductor device from the voltage output circuit 34 and supplies a voltage to the outside from the voltage output circuit 34 via the voltage output terminal 34.

As has been discussed, the semiconductor device of the fourth embodiment is different from the semiconductor device of the first embodiment in that the cathode of the diode 11 is connected to the terminal for supplying a voltage to the outside.

As in the first embodiment, the gate voltage of a high withstand voltage transistor 6 is set such that the source voltage of the high withstand voltage transistor 6 is equal to or lower than the drain withstand voltage of an N-channel MOS transistor 2 and the diode 11 is normally turned off.

According to the semiconductor device, the ESD tolerances of an output terminal 7 and the voltage output terminal 33 can be increased by a single ESD protection circuit 14. Furthermore, it is possible to obtain the same effect as the first embodiment. As in the second embodiment, an NPN bipolar transistor may be provided instead of the high withstand voltage transistor 6.

Fifth Embodiment

Figure 6:
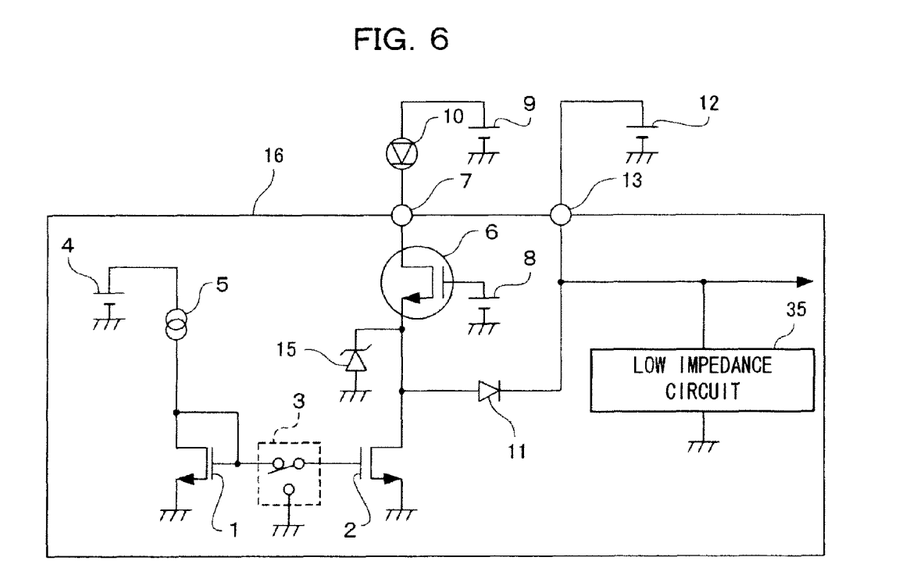
FIG. 6 shows the schematic configuration of the main part of the semiconductor device according to the fifth embodiment of the present invention.

Referring to FIG. 6, the following will describe a semiconductor device according to a fifth embodiment of the present invention. Members corresponding to the members described in the first embodiment will be indicated by the same reference numerals and the explanation thereof is omitted.

FIG. 6 shows the schematic configuration of the main part of the semiconductor device according to the fifth embodiment of the present invention. As shown in FIG. 6, the semiconductor device is different from the semiconductor device of the first embodiment in that a low impedance circuit 35 provided between a power supply input terminal 13 and the ground is used as an ESD protection circuit. The low impedance circuit 35 includes a resistance component and/or a capacitance component so as to have a low impedance between the power supply input terminal 13 and the ground.

In the semiconductor device of the first embodiment, ESD having been applied to the output terminal 7 and passed through the high withstand voltage transistor 6 is released to the ground potential through the diode 11 and the N-channel MOS transistor having the grounded gate and source, whereas in the semiconductor device of the fifth embodiment, ESD is released to the low impedance circuit 35. According to the semiconductor device, it is possible to obtain the same effect as the first embodiment.

As in the second embodiment, an NPN bipolar transistor may be provided instead of a high withstand voltage transistor 6. Further, as in the third embodiment, the cathode of a diode 11 may be connected only to the low impedance circuit 35. In this case, however, the low impedance circuit 35 has a terminal connected to the diode 11 and the terminal has to be set at a voltage where the diode 11 is normally turned off. Moreover, as in the fourth embodiment, the cathode of the diode 11 may be connected to a voltage output terminal.

Sixth Embodiment

Figure 7:
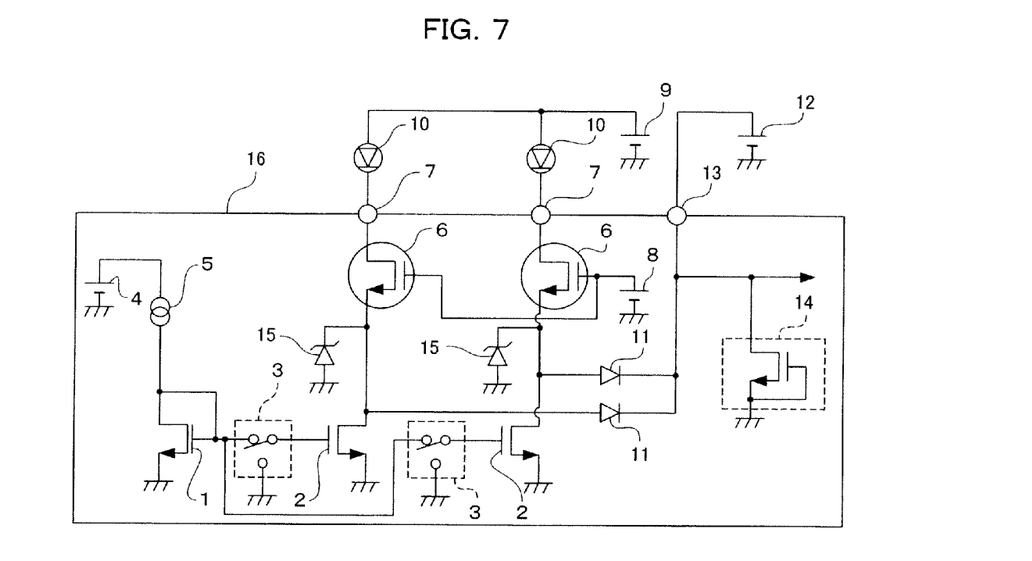
FIG. 7 shows the schematic configuration of the main part of the semiconductor device according to the sixth embodiment of the present invention.

Referring to FIG. 7, the following will describe a semiconductor device according to a sixth embodiment of the present invention. Members corresponding to the members described in the first embodiment will be indicated by the same reference numerals and the explanation thereof is omitted.

FIG. 7 shows the schematic configuration of the main part of the semiconductor device according to the sixth embodiment of the present invention. As shown in FIG. 7, the semiconductor device is different from the semiconductor device of the first embodiment in that a plurality of LED driving output terminals are provided.

In other words, as shown in FIG. 7, the semiconductor device has two output terminals 7 and LEDs 10 fed with a voltage in a shared manner from a constant voltage source 9 are respectively connected to the output terminals 7 outside the semiconductor device. Further, in the semiconductor device, current driving output circuits each of which includes a high withstand voltage transistor 6, an N-channel MOS transistor 2, a switch circuit 3, and a diode 11 are respectively connected to the output terminals 7. The gates of the N-channel MOS transistors 2 in the current driving output circuits are connected in common to the gate of an N-channel MOS transistor 1 via the switch circuits 3. Moreover, the cathodes of the diodes 11 in the current driving output circuits are connected in common to an ESD protection circuit 14 and a power supply input terminal 13.

With this configuration, the ESD tolerances of the two LED driving output terminals and the single power supply input terminal 13 can be increased by the single ESD protection circuit. And besides, the same effect as the first embodiment can be obtained.

In the foregoing explanation, the number of LED driving output terminals is two. As a matter of course, the present invention can be similarly implemented for a semiconductor device including three or more LED driving output terminals.

As in the second embodiment, an NPN bipolar transistor may be provided instead of the high withstand voltage transistor 6. Further, as in the third embodiment, the cathode of the diode 11 may be connected only to the ESD protection circuit 14. Moreover, as in the fourth embodiment, the cathode of the diode 11 may be connected to a voltage output terminal. Further, as in the fifth embodiment, a low impedance circuit may be used instead of the N-channel MOS transistor having the grounded gate and source.

Seventh Embodiment

Figure 8:
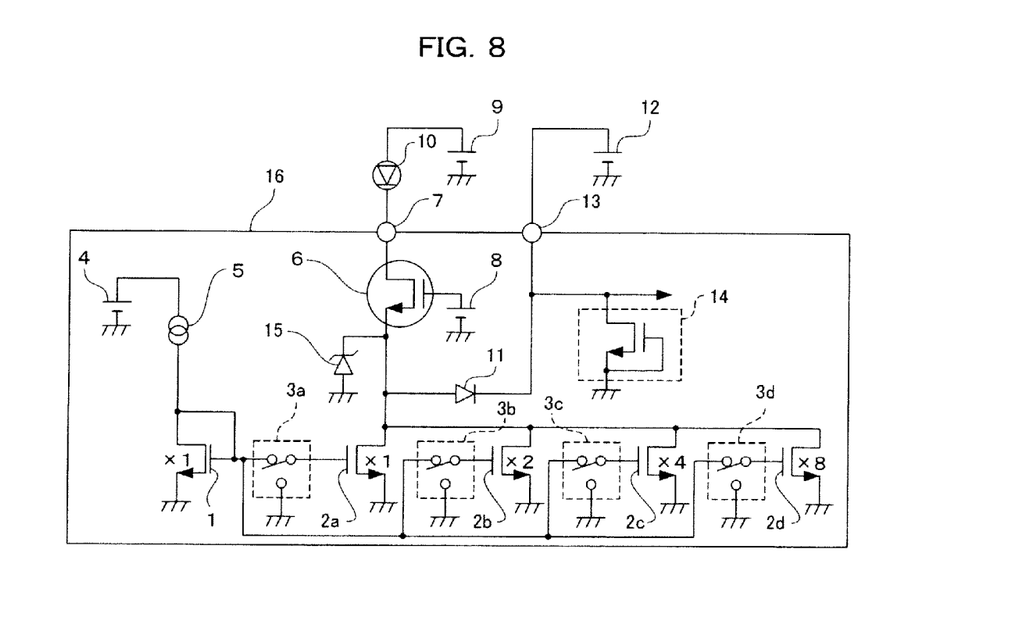
FIG. 8 shows the schematic configuration of the main part of the semiconductor device according to the seventh embodiment of the present invention.

Referring to FIG. 8, the following will describe a semiconductor device according to a seventh embodiment of the present invention. Members corresponding to the members described in the first embodiment will be indicated by the same reference numerals and the explanation thereof is omitted.

FIG. 8 shows the schematic configuration of the main part of the semiconductor device according to the seventh embodiment of the present invention. As shown in FIG. 8, the semiconductor device is different from the semiconductor device of the first embodiment in that the current value of an LED driving current can be controlled by four bits.

In other words, as shown in FIG. 8, the semiconductor device includes an N-channel MOS transistor 2a having a gate width as large as the gate width of an N-channel MOS transistor 1, an N-channel MOS transistor 2b having a gate width twice as large as the gate width of the N-channel MOS transistor 1, an N-channel MOS transistor 2c having a gate width four times as large as the gate width of the N-channel MOS transistor 1, and an N-channel MOS transistor 2d having a gate width eight times as large as the gate width of the N-channel MOS transistor 1. To the gates of the N-channel MOS transistors 2a to 2d, switch circuits 3a to 3d are respectively connected. The gates of the N-channel MOS transistors 2a to 2d are connected in common to the gate of the N-channel MOS transistor 1 via the switch circuits 3a to 3d. The drains of the N-channel MOS transistors 2a to 2d are connected in common to a high withstand voltage transistor 6. With this configuration, the current value of an output terminal 7 can be controlled by four bits by controlling the on/off of the switch circuits 3a to 3d.

According to the semiconductor device, an ESD protection circuit 14 is connected to the drains of the N-channel MOS transistors 2a to 2d via a diode 11, so that the N-channel MOS transistors 2a to 2d can be protected from ESD. And besides, the same effect as the first embodiment can be obtained.

In the foregoing explanation, the LED driving current is controlled by four bits. As a matter of course, the LED driving current may be controlled by any bits.

As in the second embodiment, an NPN bipolar transistor may be provided instead of the high withstand voltage transistor 6. Further, as in the third embodiment, the cathode of the diode 11 may be connected only to the ESD protection circuit 14. Moreover, as in the fourth embodiment, the cathode of the diode 11 may be connected to a voltage output terminal. Further, as in the fifth embodiment, a low impedance circuit may be used instead of the N-channel MOS transistor having the grounded gate and source. Moreover, as in the sixth embodiment, a plurality of LED driving output terminals may be provided.

INDUSTRIAL APPLICABILITY

According to a semiconductor device of the present invention, it is possible to increase the withstand voltage of a current driving output terminal and the ESD tolerance of the current driving output terminal and improve the response speed of current passing through the current driving output terminal. Thus the present invention is useful for an LED driver IC and so on.

The invention claimed is:

1. A semiconductor device comprising:
    a current driving output terminal;
    one of a first transistor and a low withstand voltage element;
    a second transistor having a terminal connected to the current driving output terminal, a terminal connected to one of the first transistor and the low withstand voltage element, and a control terminal, and having a higher withstand voltage than one of the first transistor and the low withstand voltage element;
    an ESD protection circuit; and
    a diode having an anode connected to a path between one of the first transistor and the low withstand voltage element and the second transistor and a cathode connected to the ESD protection circuit.

2. The semiconductor device according to claim 1, wherein the control terminal of the second transistor is fed with a voltage set so as to normally turn off the diode.

3. The semiconductor device according to claim 1, further comprising a terminal different from the current driving output terminal, the terminal being connected to a junction of the ESD protection circuit and the diode.

4. The semiconductor device according to claim 1, further comprising a plurality of current driving output circuits, each having one of the first transistor and the low withstand voltage element, the second transistor, and the diode,
    wherein the diodes of the current driving output circuits are connected in common to the ESD protection circuit.

5. The semiconductor device according to claim 1, wherein the semiconductor device comprises the plurality of first transistors connected in common to the second transistor.

6. The semiconductor device according to claim 1, wherein the diode has a P-type diffusion layer and an N-type diffusion layer composing a PN junction with the P-type diffusion layer, the P-type diffusion layer acts as an anode, and the N-type diffusion layer acts as a cathode.

7. The semiconductor device according to claim 1, further comprising a voltage clamping circuit connected to the terminal of the second transistor, the terminal being connected to one of the first transistor and the low withstand voltage element.

8. The semiconductor device according to claim 1, wherein the second transistor is one of a high withstand voltage MOS transistor and a bipolar transistor and the first transistor is a MOS transistor having a lower withstand voltage than the second transistor.

9. The semiconductor device according to claim 1, wherein the second transistor is one of a high withstand voltage MOS transistor and a bipolar transistor and the low withstand voltage element is a capacitor.

10. The semiconductor device according to claim 1, wherein the ESD protection circuit is made up of an N-channel MOS transistor having a drain connected to the diode and having a grounded gate and source or having a gate-to-source voltage set to be not higher than a threshold voltage of the gate.

11. The semiconductor device according to claim 1, wherein the ESD protection circuit is a low impedance circuit.

* * * * *